US005689186A

United States Patent [19]

Maier et al.

[11] Patent Number: 5,689,186

[45] Date of Patent: Nov. 18, 1997

[54] METHOD FOR PRODUCING AN OFF-CENTER IMAGE USING AN EPI PULSE SEQUENCE

[75] Inventors: Joseph Kenneth Maier, Milwaukee; Frederick Howard Epstein, Elm Grove; Xiaohong Zhou, Franklin; Lawrence Edward Ploetz, Brookfield; Paul E. Licato, Wauwatosa, all of Wis.

[73] Assignee: General Electric Company, Milwaukee, Wis.

[21] Appl. No.: 577,000

[22] Filed: Dec. 26, 1995

[51] Int. Cl.$^6$ ........ G01V 3/00

[52] U.S. Cl. ........ 324/309; 324/307

[58] Field of Search ........ 324/300, 306, 324/307, 309, 312, 314

[56] References Cited

U.S. PATENT DOCUMENTS

| | | | |
|---|---|---|---|
| 5,151,656 | 9/1992 | Maier et al. | 324/309 |
| 5,289,127 | 2/1994 | Doddrell et al. | 324/309 |
| 5,378,985 | 1/1995 | Hinks | 324/309 |
| 5,539,311 | 7/1996 | Takiguchi et al. | 324/309 |
| 5,541,513 | 7/1996 | Maier | 324/309 |

*Primary Examiner*—Louis M. Arana

*Attorney, Agent, or Firm*—Quarles & Brady

[57] ABSTRACT

An off-center NMR image is produced using an EPI pulse sequence. The offset along the readout gradient axis is achieved by shifting the frequency of an RF reference signal used to demodulate the received NMR echo signals. Phase errors produced by the NMR system and by the shifts in reference signal frequency are corrected in "real time" by also shifting the phase of the RF reference signal.

8 Claims, 3 Drawing Sheets

COMPUTER SYSTEM
CPU
MEMORY
107
IMAGE PROCESSOR
106
GRADIENT AMPS
$G_Z$ AMP
$G_Y$ AMP
$G_X$ AMP
PHYSIOLOGICAL ACQUISITION CONTROLLER
SYSTEM CONTROL
CPU
PULSE GENERATOR
TRANSCEIVER
MEMORY
ARRAY PROCESSOR
SCAN ROOM INTERFACE
PATIENT POSITIONING SYSTEM
PRE-AMPLIFIER
T/R SWITCH
RF AMPLIFIER 100
102
104
108
111
112
113
115
116
118
119
121
122
125
127
129
133
134
139
140
141
150
151
152
153
154
160
161

200
FREQUENCY SYNTHESIZER
10MHz
5MHz
60MHz
REFERENCE FREQUENCY GENERATOR
250 KHz
210
DIGITAL DETECTOR & PROCESSOR
A/D
209
201
204
203
212
202
MODULATOR & UP CONVERTER
2.5MHz
DOWN CONVERTER
205
201
208
EXCITER ATTENUATOR
206
153
207
151
POWER AMPLIFIER
PRE-AMP
RECEIVER ATTENUATOR
152A
152B
118

TE
90°
250
RF
253
251
SLICE SELECT GRADIENT
252
255
READOUT GRADIENT
256
258
PHASE ENCODING GRADIENT
259

255
$G_X(t)$
253
ECHO SIGNALS
262
RF FREQUENCY
−Δf
Δf
RF PHASE
φ
−φ
264

$\phi_{FOV}(t)$
φFOV
φ(1)
$t_e(1)+t_e(2)$
STEP1
φ(2)
ROW FLIP
PIVOT
STEP2
STEP1
φ(3)
+TIME
t(1)
t(2)
t(3)
$t_o$
$t_e(1)$
$t_e(2)$
$t_e(3)$
$G_X(t)$
270
272
+TIME
DATA ACG

METHOD FOR PRODUCING AN OFF-CENTER IMAGE USING AN EPI PULSE SEQUENCE

BACKGROUND OF THE INVENTION

The field of the invention is nuclear magnetic resonance imaging (MRI) methods and systems. More particularly, the invention relates to implementing imaging pulse sequences that employ bipolar readout gradients, such as echo planar imaging (EPI) pulse sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a radio frequency magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The concept of acquiring NMR image data in a short time period has been known since 1977 when the echo-planar pulse sequence was proposed by Peter Mansfield (J. Phys. C.10: L55–L58, 1977). In contrast to standard pulse sequences, the echo-planar pulse sequence produces a set of NMR signals for each RF excitation pulse. These NMR signals can be separately phase encoded so that an image can be acquired in a single pulse sequence of 20 to 100 milliseconds in duration. The advantages of echo-planar imaging ("EPI") are well-known, and there has been a long felt need for apparatus and methods which will enable EPI to be practiced in a clinical setting. Other echo-planar pulse sequences are disclosed in U.S. Pat. No. 4,678,996; 4,733,188; 4,716,369; 4,355,282; 4,588,948 and 4,752,735.

The EPI pulse sequence is characterized by a readout gradient that alternates in polarity as successive NMR echo signals are produced and acquired. As a result, the sampled data in alternate rows of k-space is reversed in order and must be inverted prior to performing a Fourier transformation for image reconstruction. This reversal of alternate rows of the raw NMR data set introduces phase errors caused by a number of hardware-related factors. These may be reduced or eliminated by practicing the invention disclosed in U.S. Pat. No. 5,151,656 entitled "*Correction of NMR Data Acquired By An Echo-Planar Technique*". Quality images are thus obtained using an EPI pulse sequence, but the image field-of-view ("FOV") must be centered on the isocenter of the readout gradient field. If the FOV is offset from the isocenter (eg. a patient's shoulder) prior methods do not work and significant image artifacts are produced.

SUMMARY OF THE INVENTION

The present invention is a method for producing an off-center image using an EPI pulse sequence on an MRI system. More specifically, the method includes: applying an RF excitation field to spins in the subject to be imaged to produce transverse magnetization; applying a readout magnetic field gradient to the spins which alternates in polarity and produces a series of NMR echo signals of alternating polarity; receiving the series of NMR echo signals and demodulating them with a reference signal that shifts in frequency by an amount ($\Delta f$) from a center reference frequency ($f_0$) as successive NMR echo signals are received; digitizing the series of demodulated NMR echo signals and storing them at successive rows; reversing the digitized NMR echo signals in alternate rows; and reconstructing an image from the digitized NMR echo signals; and wherein the received NMR echo signals are phase corrected to reduce a bipolar phase split caused by the shifted reference signal.

A general object of the invention is to produce an off-center image using an EPI pulse sequence. The amount of the frequency shift ($\Delta f$) determines the distance the image is offset from the isocenter of the MRI system. This same frequency shift, however, introduces a bipolar phase split in the digitized NMR data set from which the image is reconstructed. It has been discovered that this bipolar phase split produces unacceptable artifacts in the reconstructed image unless it is corrected.

Another object of the invention is to correct the bipolar phase split caused by shifting the reference frequency during an EPI pulse sequence. The frequency shift ($\Delta f$) and the bipolar phase split can be calculated after the operator specifies the distance the image is to be offset from the system isocenter. In one embodiment, the phase correction is made in real time by also changing the phase of the reference signal an appropriate amount at the same time its frequency is shifted during acquisition of the echo signals. In another embodiment, the phase correction is made on each row of the digitized NMR data set after acquisition and just prior to image reconstruction.

DESCRIPTION OF THE PREFERRED EMBODIMENT

Figure 1:
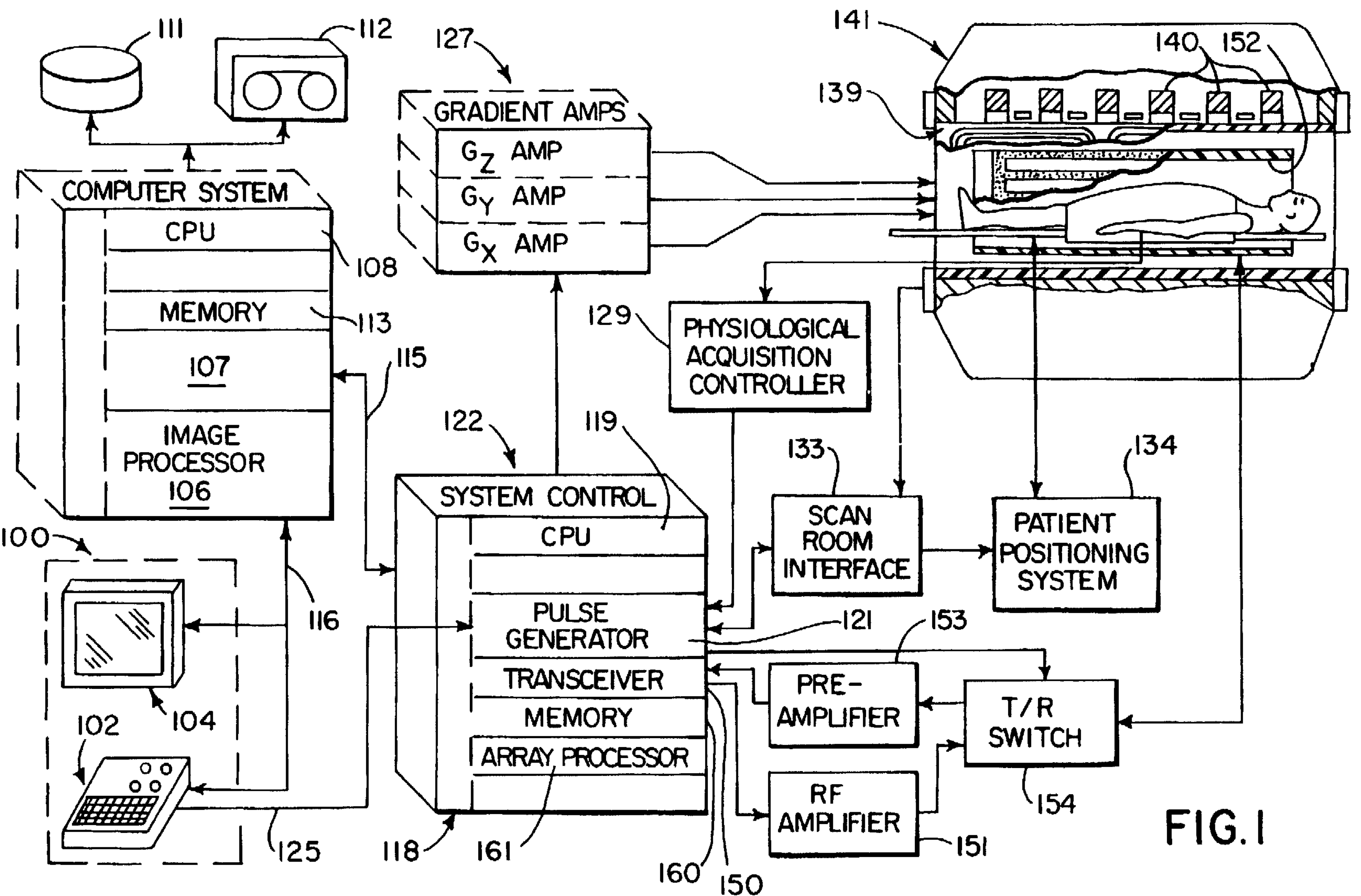
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 112 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. For each pulse sequence to be performed during a scan, it stores a pulse sequence data base (PSD) that is read out during the execution of the pulse sequence to produce signals that control the operation of the MRI system. For example, it produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

As will be described in more detail below, it is an important aspect of the present invention that the pulse generator module 121 produces signals during a scan which control the reference frequency and reference phase of a receiver section of a transceiver module 150.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients. The gradient coil assembly 139 forms part of a magnet assembly 141 which includes a polarizing magnet 140 and a whole-body RF coil 152.

The transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals received by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
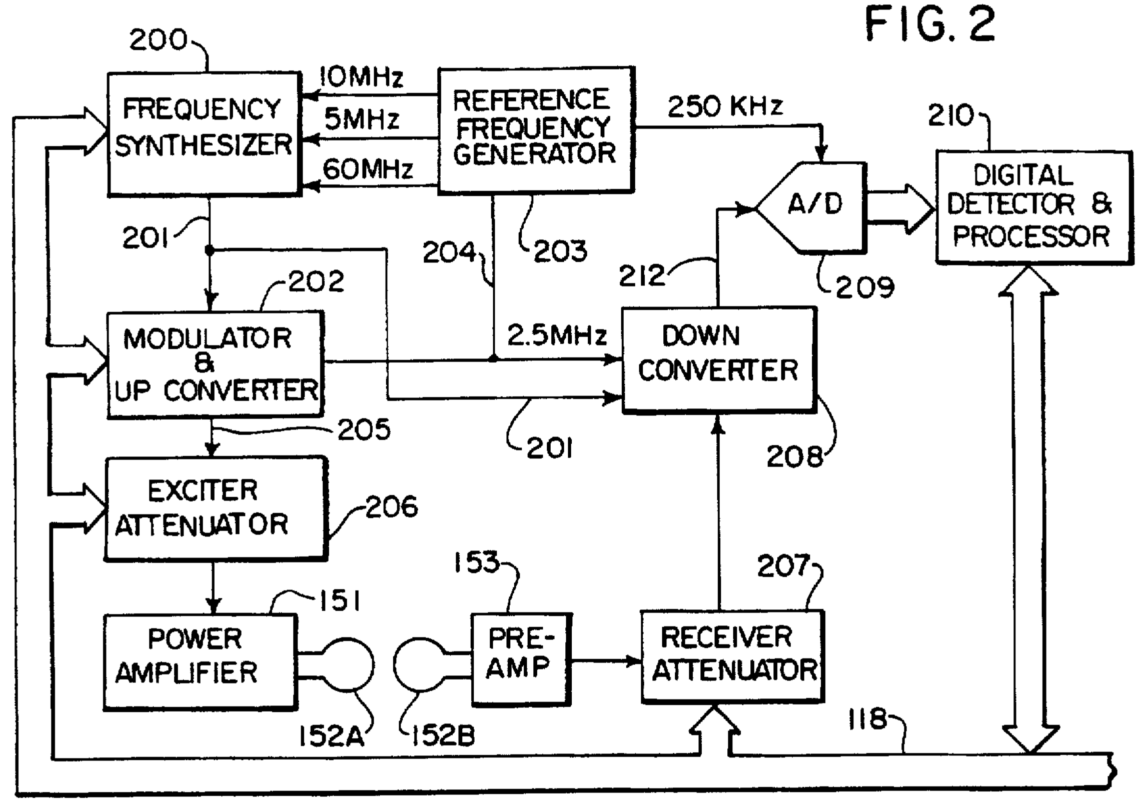
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values from the PSD. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2, the signal produced by the subject is picked up by the receiver coil 152B and applied through the preamplifier 153 to the input of a receiver 207. The receiver 207 further amplifies the signal by an amount determined by a digital attenuation signal received from the backplane 118.

The received signal is at or around the Larmor frequency, and this high frequency signal is down converted in a two step process by a down converter 208 which first mixes the signal with the carrier signal on line 201 and then mixes the resulting difference signal with the 2.5 Mhz reference signal on line 204. It is an important aspect of the present invention that the frequency and phase of the carrier signal on line 201 is controlled by commands from the pulse generator module 121 during the receipt of an NMR signal. That is, as the NMR signal is being acquired, the reference frequency and reference phase of the receiver is controlled in accordance with data read out of the PSD being "played out" by the pulse generator module 121.

The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 Mhz reference signal as well as the 250 Khz sampling signal and the 5, 10 and 60 Mhz reference signals are produced by a reference frequency generator 203 from a common 20 Mhz master clock signal. For a more detailed description of the receiver, reference is made to U.S. Pat. No. 4,992,736 which is incorporated herein by reference.

Figure 3:
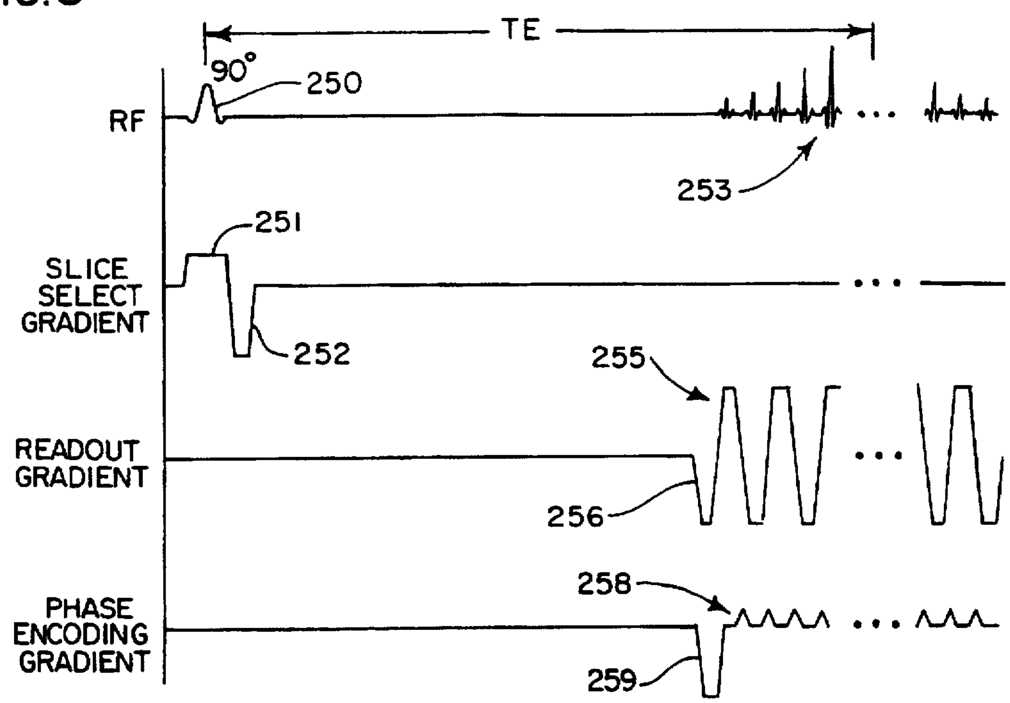
FIG. 3 is a graphic representation of an EPI pulse sequence executed by the MRI system of FIG. 1.

An EPI pulse sequence with which the method of the preferred embodiment of the invention may be employed is illustrated in FIG. 3. A 90° RF excitation pulse 250 is applied in the presence of a $G_z$ slice selection gradient pulse 251 to produce transverse magnetization in a slice through the subject. The excited spins are rephased by a negative lobe 252 on the slice select gradient $G_z$ and then a time interval elapses before the readout sequence begins. A total of 64 or 128 separate NMR echo signals, indicated generally at 253, are acquired during this EPI pulse sequence, although the number of signals acquired may be reduced and the pulse sequence repeated one or more times during a scan. Each NMR echo signal is a different view which is separately phase encoded to scan $k_y$-space in monotonic order. The readout sequence is positioned such that the view acquired at $k_y=0$ occurs at the desired echo time (TE).

The NMR echo signals 253 are gradient recalled echo's produced by the readout gradient field 255. The readout sequence is started with a negative readout gradient lobe 256 and the echo signals 253 are produced as the readout gradient oscillates between positive and negative values. A total of $k_{xmax}$ samples are taken of each NMR echo signal 253 during each readout gradient pulse 255. The successive NMR echo signals 253 are separately phase encoded by a series of $G_y$ phase encoding gradient pulses 258. The first pulse is a negative lobe 259 that occurs before the echo signals are acquired to encode the first view at $k_y=-k_{ymax/2}$. Subsequent phase encoding pulses 258 occur as the readout gradient pulses 255 switch polarity, and they step the phase encoding monotonically upward through $k_y$ space.

At the completion of the EPI pulse sequence, therefore, $k_{xmax}$ separate frequency encoded samples of $k_{ymax}$ separately phase encoded NMR echo signals 253 have been acquired. The resulting NMR data set includes a row of digitized samples for each echo signal. After zero filling and filtering, this $k_{xmax}\times k_{ymax}$ element array of complex numbers is Fourier transformed along both of its dimensions ($k_y$ and $k_x$) to produce an array of image data that indicates the NMR signal magnitude along each of its two dimensions (y and x).

To produce an image which is offset from the MRI system isocenter the frequency of the RF excitation pulse is usually changed by the appropriate amount. However, this strategy is not sufficient with an EPI pulse sequence because the polarity of the readout gradient is alternated for successive echo signals and the shift in frequency must also alternate in polarity. Since a single RF excitation pulse is used in the EPI pulse sequence, obviously such alternating frequency shifts cannot be achieved during RF transmission.

One aspect of the present invention is to achieve an off-center image using an EPI pulse sequence by shifting the frequency of the reference signal used to demodulate the echo signals as they are received. Referring to FIG. 2, the frequency of the reference signal on line 201 is shifted by an amount $\Delta f$ from the carrier frequency $f_0$:

$$\Delta f=\gamma G_x \Delta x \quad [1]$$

where:

$\gamma$=gyromagnetic ratio for spins;

$G_x$=readout gradient strength;

$\Delta x$=offset of FOV along readout axis.

Figure 4:
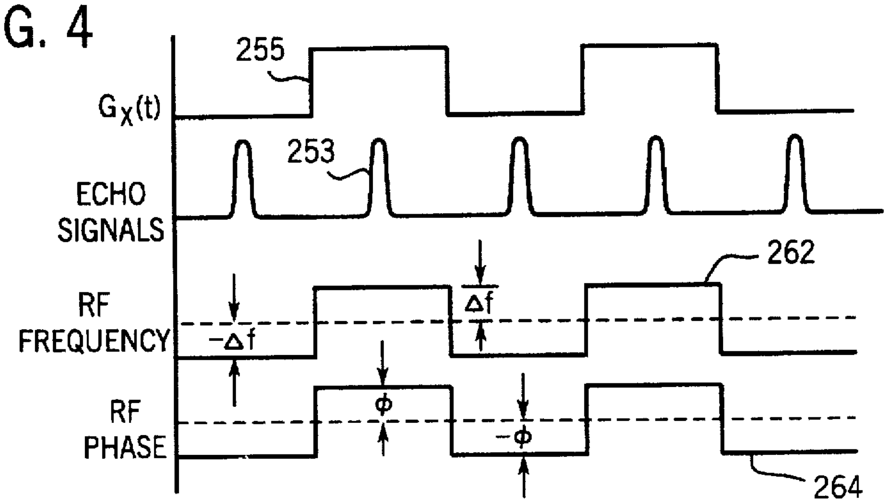
FIG. 4 is a graphic representation of the shifting in reference signal frequency and phase in synchronism with the alternating readout gradient.

In addition, the direction, or polarity of this frequency shift $\Delta f$ is alternated as each echo signal in the EPI pulse sequence is received because the sign of $G_x$ alternates. As shown in FIG. 4, after producing an RF excitation pulse at carrier frequency $f_0$, the reference signal frequency is shifted in synchronism with the readout gradient 255 as indicated by waveform 262. This insures that the field of view ("FOV") of each acquired echo signal 253 is the same despite the fact that the readout gradient 255 is alternating in polarity. Of course, since the alternating readout gradient also alternates the direction in which k-space is scanned, the order of the digitized samples of each echo signal 253 must be reversed in alternate rows before image reconstruction.

While this alternating frequency shift enables the proper NMR data to be acquired to reconstruct the desired off-center image, it has been discovered that the above-described process introduces a phase shift into the NMR data set which results in unacceptable artifacts in the reconstructed image. The phase shift is referred to herein as the "bipolar phase split", and its magnitude is directly related to the amount of frequency shift $\Delta f$ used during the demodulation process.

$$\phi=(-1)^{n-1}2\pi|\Delta f|t \quad [2]$$

where:

n=echo signal index from 1 to N where N is the total number of echoes in the pulse sequence;

t=time from moment frequency is shifted to the center of the acquired echo signal.

The magnitude of the bipolar phase split may thus be calculated prior to the scan.

The correction of the acquired NMR data set for the bipolar phase split can be achieved in either of two ways. As described in the above-cited U.S. Pat. No. 5,151,656, which is hereby incorporated by reference, phase corrections can be made on each row of the acquired NMR data set after the scan is complete. In this case, every other row is phase shifted $2\phi$ to bring it into phase with adjacent rows. In the alternative, odd rows may be phase shifted one direction by $\phi$ and even rows phase shifted in the other direction by $\phi$ to bring all rows into phase.

The preferred method for correcting the bipolar phase split is to change the phase of the RF reference signal used to demodulate the received echo signal. Referring to FIGS. 2 and 4, the phase of the carrier signal on line 201 used to demodulate the received echo signal is shifted in synchronism with the readout gradient 255 as shown by waveform 264. That is, as the pulse sequence is played out by the pulse generator 121, the transceiver module 150 is commanded to shift the frequency of the reference carrier signal on line 201 by an amount $\Delta f$ needed to center the image at the desired off-axis location. At the same time, the transceiver module 150 is commanded to shift the phase of this reference carrier signal by an amount-$\phi$ needed to correct the bipolar phase split. Both shifts alternate in synchronism with the readout gradient 255. The advantage of this "real time" phase correction of the acquired echo signals is that no additional time is required during image reconstruction to correct signal phase.

As indicated in the above-cited U.S. Pat. No. 5,151,656, other phase corrections are necessary to the echo signals acquired using an EPI pulse sequence. Phase errors are introduced due to limitations in MRI system hardware which shift the location of the echo signal peak with respect to the midpoint of the data acquisition window, and which shift the location of the echo signal peak relative to the shift in RF reference signal frequency. These phase errors can be measured during a calibration scan during which no phase encoding is applied, and corrective values can be calculated. These hardware phase corrections can be added to the bipolar phase split correction $\phi$ and applied in real time to the received echo signals as described above.

Figure 5:
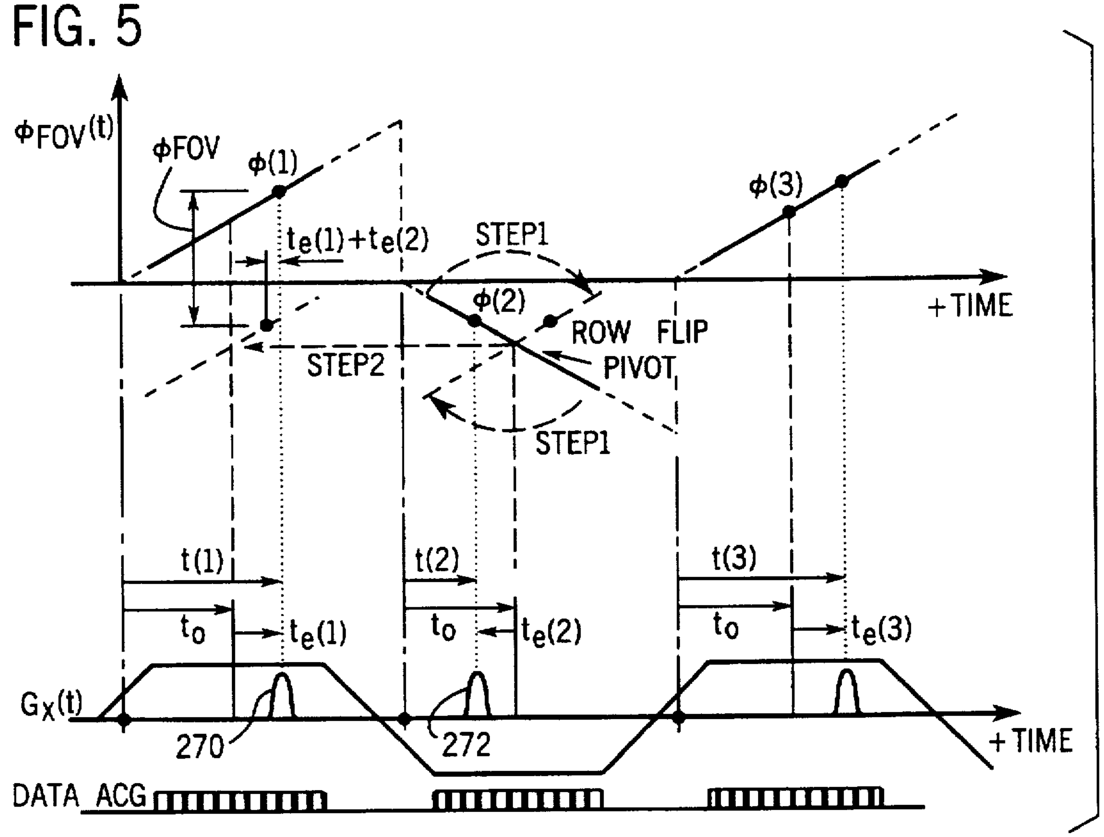
FIG. 5 is a graphic illustration of how the bipolar phase split is produced.

The total phase shift $\phi$ to be applied to each acquired echo signal to account for hardware dependent phase shifts $\phi_0$ and for phase shifts due to the $\Delta f$ bipolar phase split $\phi_{FOV}$ may be explained in graphic terms by reference to FIG. 5. In this illustration two echo signals 270 and 272 are acquired with opposite polarity readout gradient $G_x(t)$. The order of the acquired samples in echo signal 272 is reversed in the graphic step 1. The reversed echo is then slid to the left in step 2 until its data acquisition window center matches that of the echo signal 270. The resulting vertical distance between the centers of the two successive echoes is the bipolar phase split $\phi_{FOV}$.

With reference to FIG. 5, the complete phase shift for each echo in the EPI pulse sequence may be expressed as follows:

$$\phi(n)=\phi_{FOV}(n)+\phi_0(n) \text{ radians}$$

$$\phi_{FOV}(n)=(-1)^{n-1}\ 2\pi|\Delta f(n)|t(n) \text{ radians}$$

$$\Delta f(n)=\gamma G_x(n)\ \Delta x \text{ hertz}$$

$$t(n)=t_o+t_e(n) \text{ seconds}$$

where:

n=echo index from [1 . . . N] where N is the echo train length;

$\gamma$=gyromagnetic ratio for protons;

$G_x$(n)=signed readout gradient flat top amplitude (gauss/cm) for echo n;

$\Delta$x=signed $OCFOV_x$ offset (cm);

t(n)=total time (sec), ending at echo center, over which phase evolves at $\Delta f$;

$t_0$=hardware & scan dependent delay (sec) from setting of phase/frequency to acquisition window center;

$t_e$(n)=prescan dependent, signed shift (sec) of echo n from acquisition window center;

$\Delta$f(n)=nth echo's demodulation frequency offset (hz) for an $OCFOV_x$ shift of $\Delta$x cm;

$\phi$(n)=total receiver phase (rad) set at start of $t_0$ interval for echo n to remove total phase shift;

$\phi_{FOV}$(n)=receiver phase shift (rad) set at start of $t_0$ interval for echo n to remove $\Delta$f(n) related bipolar phase split;

$\phi_0$(n)="OCFOVx independent" part of receiver phase shift (rad) set at start of $t_0$ interval for echo n.

It should be apparent to those skilled in the art that while the present invention is described with reference to an EPI pulse sequence, the invention may be applicable to any pulse sequence in which multiple echo signals are acquired using a readout gradient that alternates in polarity.

We claim:

1. Method for correcting phase errors produced by an NMR system during the acquisition of an NMR image data array using an echo-planar pulse sequence, the steps comprising:

a) calculating a phase shift ($\phi$) for each NMR echo signal in the echo-planar pulse sequence;

b) performing the echo-planar pulse sequence by i) producing an RF excitation pulse using an RF reference signal;

ii) producing a readout magnetic field gradient which alternates in value to produce a corresponding series of NMR echo signals;

iii) receiving each of said NMR echo signals and demodulating each with an RF reference signal that has been shifted in phase in synchronism with the alternating readout magnetic field gradient by its corresponding calculated phase shift ($\phi$); and iv) storing each demodulated NMR echo signal to form an NMR data set; and c) reconstructing an image from the NMR data set.

2. The method as recited in claim 1 in which the phase shift ($\phi$) for each NMR echo is calculated by:

i) performing a calibration scan using the echo-planar pulse sequence to determine a phase error component ($\phi_0$) caused by the NMR system.

3. The method as recited in claim 2 in which the frequency of the RF reference signal used to demodulate each NMR echo signal is shifted ($\Delta$f) and the phase shift $\phi$ is calculated by:

ii) calculating a bipolar phase split $\phi_{FOV}$ using the frequency shift ($\Delta$f); and iii) combining the phase error component ($\phi_0$) and the bipolar phase split ($\phi_{FOV}$).

4. The method as recited in claim 3 in which the bipolar phase split ($\phi_{FOV}$) is calculated from the relationship:

$$\phi_{FOV}=[2\pi|\Delta f|t]2\pi|\Delta f|t$$

where t is the time interval between the shift in frequency ($\Delta$f) and the center of the acquired NMR echo signal.

5. A method for producing an off-center NMR image using an echo-planar sequence, the steps comprising:

a) determining a distance $\Delta$x which the image is to be offset from isocenter along a readout magnetic field gradient axis;

b) calculating a frequency shift ($\Delta$f) using the distance $\Delta$x and the magnitude of the readout magnetic field gradient used in the echo-planar pulse sequence;

c) performing a scan by executing the echo-planar sequence by i) producing an RF excitation pulse using an RF reference signal;

ii) producing the readout magnetic field gradient which alternates in value to produce a corresponding series of NMR echo signals;

iii) receiving each of said NMR echo signals and demodulating each with an RF reference signal that has been shifted in frequency by the calculated frequency shift ($\Delta$f); and iv) storing each demodulated NMR echo signal to form an NMR data set; and d) reconstructing the off-center NMR image from the NMR data set.

6. The method as recited in claim 5 in which a bipolar phase split ($\phi_{FOV}$) is calculated using the calculated frequency shift ($\Delta$f), and the phase of received NMR echo signals are corrected using the calculated bipolar phase split ($\phi_{FOV}$).

7. The method as recited in claim 6 in which the correction of the received NMR echo signals is performed by shifting the phase of the RF reference signal used during the demodulation step (iii) by an amount determined by the calculated bipolar phase split ($\phi_{FOV}$).

8. The method as recited in claim 7 in which the RF reference signal used during the demodulation step iii) is shifted in frequency ($\Delta$f) and in phase ($\phi_{FOV}$) in synchronizing with the alternations in the readout magnetic field gradient.

* * * * *